United States Patent [19]

Yamamoto et al.

[11] Patent Number: 4,986,848

[45] Date of Patent: Jan. 22, 1991

[54] CATALYST FOR ELECTROLESS PLATING

[75] Inventors: Hiroshi Yamamoto, Yuki; Takeshi Shimazaki, Hitachi; Kazuichi Kuramochi, Shimodate, all of Japan

[73] Assignee: Hitachi Chemical Company, Ltd., Tokyo, Japan

[21] Appl. No.: 298,967

[22] Filed: Jan. 19, 1989

[30] Foreign Application Priority Data

Jan. 28, 1988 [JP] Japan .................................. 63-18132
May 6, 1988 [JP] Japan ................................ 63-110862

[51] Int. Cl.$^5$ ............................................. C23C 18/08
[52] U.S. Cl. .................................................. 106/1.11
[58] Field of Search ........................................ 106/1.11

[56] References Cited

U.S. PATENT DOCUMENTS

| | | | |
|---|---|---|---|
| 3,960,573 | 6/1976 | Zeblisky | 106/1.11 |
| 3,962,494 | 6/1976 | Nuzzi | 106/1.11 |
| 3,962,496 | 6/1976 | Leech | 106/1.11 |
| 3,962,497 | 6/1976 | Doty et al. | 106/1.11 |
| 3,978,252 | 8/1976 | Lombardo et al. | 106/1.11 |
| 4,248,632 | 2/1981 | Ehrich et al. | 106/1.11 |
| 4,301,196 | 11/1981 | McCormack et al. | 106/1.23 |

FOREIGN PATENT DOCUMENTS 2132172 11/1972 France .
7204414 10/1972 Netherlands .

OTHER PUBLICATIONS

Patent Abstracts of Japan, vol. 9, No. 138 (C-286), [1861] 13, Jun. 1985, & JP-A- 60 24 380 (Hitachi Ltd.).

*Primary Examiner*—Patrick P. Garvin
*Assistant Examiner*—E. D. Irzinski
*Attorney, Agent, or Firm*—Antonelli, Terry, Stout & Kraus

[57] ABSTRACT

A catalyst for electroless plating comprising a divalent palladium compound, a lower alkylamine, and aminopyridine in the form of aqeuous solution having a pH of 7 to 14 can give uniform deposition and high throwing power of copper on inner walls of through-holes in printing wiring boards without causing a hollowing phenomenon.

12 Claims, No Drawings

CATALYST FOR ELECTROLESS PLATING

BACKGROUND OF THE INVENTION

This invention relates to a catalyst for electroless plating and a process for electroless plating using said catalyst.

Electroless copper plating is widely used for forming circuits in the field of printed circuit boards. Recently, with a demand for increasing the density and the number of laminated layers, the electroless copper plating technique becomes more and more important.

Printed circuit boards, particularly high-density multi-layer printed circuit boards are generally produced as follows. An etching resist is laminated on a copper-clad laminate used as a substrate, followed by exposure to light, development, peeling of the etching resist to form a pattern. Then, the surface copper is subjected to an adhesion pre-treatment in order to improve adhesive strength of inner layers after forming multi-layers. The adhesion pre-treatment is usually carried out by either a blackening treatment or a browning treatment. The blackening treatment make copper cupric oxide, while the browning treatment make copper cupric oxide and cuprous oxide. The adhesion pretreated substrate and a prepreg are laminated and both surfaces are sandwiched by copper foils. A plurality of laminates thus prepared are heated and pressed to give a multi-layer board. Through-holes are drilled or punched in the multi-layer board and cleaned with sulfuric acid, chromic acid or a permanganate to remove the molten resin on inner copper foils. After a honing step wherein a liquid containing abrasive particles is sprayed, a high-pressure cleaning is carried out.

The thus treated multi-layer board is subjected to a plating treatment to make the through-hole walls electroconductive. The plating treatment can be carried out either by forming a plated layer of about 0.3 $\mu$m by an electroless plating, followed by thickening the plated layer to 30 to 40 $\mu$m by electroplating, or by forming a plated layer of 30 to 40 $\mu$m thick only by electroless plating.

In the case of electroless plating, since the catalyst usually used for sensitizing or seeding contains about 10% by weight of hydrochloric acid, the hydrochloric acid penetrates into cupric oxide layers obtained by the adhesion pre-treatment to produce a cupric oxide corrosion phenomenon on surfaces of inner layer circuits. This is usually called "hollowing" (pink ring formation). This phenomenon remarkably appears on blackening treated surfaces and slightly appears on browning treated surfaces.

In the case of a widely used catalyst system comprising palladium chloride and stannous chloride, there appears a defect in that a slight transmittance of light is admitted when tested by a so-called back light test wherein a hole after plating is cut vertically and transmittance of light is measured by lighting from under the inner wall side of the hole. Thus, it is difficult to obtain a complete throwing power of copper. Further, there is another problem in that the apparatus is damaged by the hydrochloric acid in the catalyst system.

On the other hand, Japanese Patent Unexamined Publication No. 60-224292 discloses the use of an alkaline aqueous solution of a palladium salt and 2-aminopyridine as a catalyst for sensitizing. But this catalyst is still insufficient to remove the hollowing phenomenon and to improve the throwing power of copper. Further, stability of the catalyst solution is insufficient.

SUMMARY OF THE INVENTION

It is an object of the present invention to provide a catalyst system for seeding or sensitizing in electroless plating without causing the hollowing phenomenon, excellent in throwing power of copper and slight in damage in apparatus.

It is another object of the present invention to provide a process for electroless plating using said catalyst system.

The present invention provide a catalyst aqueous solution for electroless plating comprising one mole of divalent palladium compound, 1 to 20 moles of a lower alkylamine and 0.5 to 10 moles of aminopyridine, said aqueous solution having a pH of 7 to 14.

The present invention also provides a process for electroless plating, which comprises alkali degreasing a material to be plated, followed by washing with water, contacting the thus treated material with a catalyst aqueous solution comprising one mole of divalent palladium compound, 1 to 20 moles of a lower alkylamine and 0.5 to 10 moles of aminopyridine, said aqueous solution having a pH of 7 to 14, followed by washing with water, contacting the thus treated material with a reducing agent to form plating nuclei, washing the thus treated material with water to remove excess catalyst for electroless plating, and dipping the thus treated material in an electroless plating bath to metallize the surfaces of the material.

DESCRIPTION OF THE PREFERRED EMBODIMENTS

As the divalent palladium compound, there can be used palladium chloride, palladium fluoride, palladium bromide, palladium iodide, palladium nitrate, palladium sulfate, and palladium sulfide, alone or as a mixture thereof.

As the lower alkylamine, there can be used those preferably having 1 to 12 carbon atoms such as monomethylamine, dimethylamine, trimethylamine, monoethylamine, diethylamine, triethylamine, monopropylamine, dipropylamine, tripropylamine, monobutylamine, dibutylamine, and tributylamine, alone or as a mixture thereof.

The lower alkylamine is used in an amount of 1 to 20 moles per mole of the divalent palladium compound. When the amount is less than 1 mole, the stability of the catalyst solution is undesirably lowered, whereas when the amount is more than 20 moles, the palladium which is a catalytic metal is hardly reduced due to too great complexing power.

As the aminopyridine, there can be used 2-aminopyridine, 3-aminopyridine and 4-aminopyridine, alone or as a mixture thereof.

The aminopyridine is used in an amount of 0.5 to 10 moles per mole of the divalent palladium compound. When the amount is less than 0.5 mole, adsorbing power of the catalyst on a material to be electroless plated such as an insulating substrate for printed circuit boards is lowered. On the other hand, when the amount is more than 10 moles, a complex of aminopyridine and palladium is produced so much that the production of an insoluble complex increases, which results in lowering the stability of the catalyst solution.

The pH of catalyst aqueous solution can be adjusted in the range of 7 to 14 by using sodium hydroxide, potassium hydroxide or sodium carbonate.

The catalyst aqueous solution of the present invention may further include a silane coupling agent in an amount of 0.001 mole or more per mole of the divalent palladium compound. By the addition of the silane coupling agent, chemical fibers such as polyester fibers, nylon fibers, etc., can be electroless plated. Needless to say, materials conventionally used as substrates for printed wiring boards by usual electroless plating, for example, substrates made from phenol resins, epoxy resins, paper-phenol resins, paper-epoxy resins, glass cloth-epoxy resins, glass fibers-epoxy resins, polyimide resins can also be electroless plated. Electroless plated polyester cloth, nylon cloth, etc. can be used as a shielding material for shielding electromagnetic waves from the outside when applied to inner walls or windows of a shielded room.

As the silane coupling agent, there can be used aminosilane coupling agents such as γ-aminopropyltriethoxysilane, γ-ureidopropyltriethoxysilane, γ-β(aminoethyl)-γ-aminopropyltrimethoxysilane, etc.; epoxysilane coupling agents such as γ-glycidoxypropyltrimethoxysilane, etc.

The silane coupling agent can be used in an amount of 0.001 mole or more per mole of the divalent palladium compound. When the amount is less than 0.001 mole, the adsorbing power on chemical fibers such as polyester and nylon fibers is lowered. On the other hand, when the amount is too large, there is almost no problem except for a change (white clouding) of surface appearance of plated coat and an economical problem. Taking the above-mentioned things into consideration, it is preferable to use the silane coupling agent in an amount of 1 mole or less per mole of the divalent palladium compound.

The catalyst aqueous solution for electroless plating of the present invention can be produced, for example, as follows.

First, in an aqueous solution of 0.05 to 5.00% by weight (0.028 to 0.113 mole/l) of sodium hydroxide, 0.86 to 4.34% by weight (0.113 to 0.56 mole/l) of monomethylamine is dissolved, followed by dissolution of 0.53 to 2.63% by weight (0.0565 to 0.28 mole/l) of 2-aminopyridine. After completely dissolving monomethylamine and 2-aminopyridine completely, 0.5 to 2.0% by weight of palladium chloride is dissolved. The resulting solution is diluted with water to give a catalyst for electroless plating having a palladium concentration of 0.01 to 1.00% by weight (0.00094 to 0.094 mole/l) and pH of 7 to 14, preferably 9.0 to 11.5. If necessary, 0.001 to 0.1% by weight of γ-ureidopropyltriethoxysilane is dissolved in the alkaline catalyst solution after complete dissolution of palladium chloride.

In a catalyst solution thus prepared, a material to be plated, e.g. a substrate such as phenol resin laminate, polyester resin laminate, epoxy resin laminate and an insulating substrate of ceramic, a plastic molded article, a plastic film, etc., after degreased, is dipped, followed by washing with water, and dipping in an aqueous solution of a reducing agent to deposit metallic palladium particles on the surface of a material to be plated. After washing with water to remove excess catalyst, the resulting material despositting metallic palladium particles on the surface is dipped in a conventional electroless plating solution of copper, nickel, etc., to carry out electroless plating.

As the aqueous solution of reducing agent, there can be used an aqueous solution of a reducing substance such as formaldehyde, stannous chloride, sodium hyposulfite, dimethylamine borane, lithium aluminum hydride, lithium borohydride, and the like, alone or as a mixture thereof. The concentration of the reducing substance changes depending on reducing power of the reducing substance used, and is preferably 0.01 to 10% by weight, more preferably 0.1 to 2.0% by weight. Preferable pH of the reducing agent aqueous solution is 7 to 14. The reducing agent aqueous solution may further contain an stabilizing agent such as a compound which can form a water-soluble complex with Cu or Pd, e.g. ethylenediaminetetraacetic acid (EDTA), ethylenediamine, etc.

This invention is illustrated by way of the following Examples, in which all percents are by weight, unless otherwise specified.

EXAMPLE 1

A copper-clad glass epoxy 4-layered board (1.6 mm thick) was drilled to form through-holes having a diameter of 0.3 mm, followed by cleaning. Then, the board was dipped in an aqueous solution comprising:

| palladium chloride | 0.05%, | (1 mole) |
|---|---|---|
| monomethylamine | 0.05%, | (2.3 moles) |
| 2-aminopyridine | 0.15%, | (5.7 moles) |
| sodium hydroxide | 0.10% | (8.9 moles) | for 5 minutes at 30° C. with moving. After removing the liquid by washing with water, the board was dipped in an aqueous solution containing 0.10% (1 mole) of dimethylamine borane and 0.50% (7.4 moles) of sodium hydroxide at 30° C. for 5 minutes with moving. After washing, the board was subjected to a treatment in an electroless copper solution comprising:

| $CuSO_4$ | 14.5 g/l |
|---|---|
| Rochelle salt | 20 g/l |
| Folmaline | 7.8 g/l |
| NaOH | 10.08 g/l | for 20 minutes, followed by washing with water and drying.

As a result, copper was uniformly deposited on inner walls of the through-holes formed in the copper-clad glass epoxy 4-layered board. No light transmittance was admitted by the back light test. Further, no hollowing phenomenon (corrosion of inner layer circuits) was admitted.

EXAMPLE 2

A copper-clad glass epoxy 4-layered board (1.6 mm thick) was drilled to form through-holes having a diameter of 0.3 mm, followed by cleaning. Then, the board was dipped in an aqueous solution comprising:

| palladium chloride | 0.10% | (1 mole) |
|---|---|---|
| dimethylamine | 0.07% | (1.6 moles) |
| 2-aminopyridine | 0.20% | (3.8 moles) |
| sodium hydroxide | 0.15% | (6.7 moles) | for 5 minutes at 30° C. with moving. After removing the liquid by washing with water, the board was dipped in an aqueous solution containing 0.20% (1 mole) of sodium borohydride and 0.50% (2.4 moles) of sodium hydroxide at 30° C. for 5 minutes with moving. After washing, the board was subjected to electroless plating in the same manner as described in Example 1.

As a result, copper was uniformly deposited on inner walls of the through-holes formed in the copper-clad glass epoxy 4-layered board. No light transmittance was admitted by the back light test. Further, no hollowing phenomenon was admitted.

EXAMPLE 3

The process of Example 1 was repeated except for using the following catalyst aqueous solution and reducing agent aqueous solution:

| Catalyst aqueous solution: | | |
|---|---|---|
| palladium chloride | 0.05% | (1 mole) |
| monomethylamine (40% aq. soln.) | 0.05% | (2.3 moles) |
| 2-aminopyridine | 0.15% | (5.7 moles) |
| sodium hydroxide | 0.1% | (8.9 moles) |
| γ-ureidopropyltriethoxysilane | 0.01% | (0.016 mole) |
| Reducing agent aqueous solution: | | |
| dimethylamine borane | 0.1% | (1 mole) |
| sodium hydroxide | 0.5% | (7.4 moles) |

As a result, copper was uniformly deposited on inner walls of the through-holes formed in the copper-clad glass epoxy 4-layered board. No light transmittance was admitted by the back light test. Further, no hollowing phenomenon was admitted.

EXAMPLE 4

The process of Example 2 was repeated except for using the following catalyst aqueous solution and reducing agent aqueous solution:

| Catalyst aqueous solution: | | |
|---|---|---|
| palladium chloride | 0.1% | (1 mole) |
| dimethylamine (50% aq. soln.) | 0.07% | (1.6 moles) |
| 2-aminopyridine | 0.2% | (3.8 moles) |
| sodium hydroxide | 0.15% | (6.7 moles) |
| γ-aminopropyltriethoxysilane | 0.05% | (0.04 mole) |
| Reducing agent aqueous solution: | | |
| sodium borohydride | 0.15% | (1 mole) |
| sodium hydroxide | 0.5% | (2.4 moles) |

As a result, copper was uniformly deposited on inner walls of the through-holes formed in the copper-clad glass epoxy 4-layered board. No light transmittance was admitted by the back light test. Further, no hollowing phenomenon was admitted.

COMPARATIVE EXAMPLE 1

A copper-clad glass epoxy 4-layered board (1.6 mm thick) was drilled to form through-holes having a diameter of 0.3 mm, followed by cleaning. Then, the board was dipped in an aqueous solution comprising:

| $PdCl_2$ | 0.30 g/l |
|---|---|
| $SnCl_2$ | 18 g/l |
| HCl | 22.2 g/l | for 10 minutes at room temperature with moving. After washing with water, the board was dipped in a solution comprising:

| Borofluoric acid | 10% |
|---|---|
| HCl | 25% | for 5 minutes at room temperature with moving. Then, electroless plating was carried out in the same manner as described in Example 1.

As a result, glass portion of the copper deposited wall surface transmitted light slightly. Further, the blackening treated inner circuits were corroded in about 30 μm thick.

As mentioned above, according to the present invention, there can be obtained advantages in that inner layer circuits of high-density multi-layer wiring boards are not corroded, uniform deposition and high throwing power of copper can be obtained on inner walls of through-holes in high-density multi-layer wiring boards, and the damage of apparatus can be reduced remarkably due to the use of the catalyst aqueous solution of the present invention having a pH of 7 to 14.

What is claimed is:

1. A catalyst aqueous solution for electroless plating comprising one mole of divalent palladium compound, 1 to 20 moles of a lower alkylamine and 0.5 to 10 moles of aminopyridine, said aqueous solution having a pH of 9.0 to 14.

2. A catalyst according to claim 1, wherein the lower alkylamine is at least one member selected from the group consisting of monomethylamine, dimethylamine, trimethylamine, monoethylamine, diethylamine, triethylamine, monopropylamine, dipropylamine, tripropylamine, monobutylamine, dibutylamine, and tributylamine.

3. A catalyst according to claim 1, wherein the palladium compound is at least one member selected from the group consisting of palladium chloride, palladium fluoride, palladium bromide, palladium iodide, palladium nitrate, palladium sulfate and palladium sulfide.

4. A catalyst according to claim 1, wherein the aminopyridine is at least one member selected from the group consisting of 2-aminopyridine, 3-aminopyridine and 4-aminopyridine.

5. A catalyst aqueous solution for electroless plating comprising one mole of divalent palladium compound, 1 to 20 moles of a lower alkylamine, 0.5 to 10 moles of aminopyridine, and 0.001 mole or more of a silane coupling agent, said aqueous solution having a pH of 9.0 to 14.

6. A catalyst according to claim 5, wherein the lower alkylamine is at least one member selected from the group consisting of monomethylamine, dimethylamine, trimethylamine, monoethylamine, diethylamine, triethylamine, monopropylamine, dipropylamine, tripropylamine, monobutylamine, dibutylamine, and tributylamine.

7. A catalyst according to claim 5, wherein the palladium compound is at least one member selected from the group consisting of palladium chloride, palladium fluoride, palladium bromide, palladium iodide, palladium nitrate, palladium sulfate and palladium sulfide.

8. A catalyst according to claim 5, wherein the aminopyridine is at least one member selected from the group consisting of 2-aminopyridine, 3-aminopyridine and 4-aminopyridine.

9. A catalyst according to claim 1, wherein the pH is 9.0 to 11.5.

10. A catalyst according to claim 1, wherein the pH of the aqueous solution is adjusted to the range of 9.0 to 14 by the addition of sodium hydroxide, potassium hydroxide or sodium carbonate.

11. A catalyst according to claim 5, wherein the pH is 9.0 to 11.5.

12. A catalyst according to claim 5, wherein the pH of the aqueous solution is adjusted to a range of 7 to 14 by adding sodium hydroxide, potassium hydroxide or sodium carbonate thereto.

* * * * *